United States Patent
Yamashita (10) Patent No.: US 11,693,308 B2
(45) Date of Patent: Jul. 4, 2023

(54) MOLDING APPARATUS THAT MOLDS COMPOSITION ON SUBSTRATE BY USING MOLD, MOLDING METHOD, AND MANUFACTURING METHOD OF ARTICLE

(71) Applicant: CANON KABUSHIKI KAISHA, Tokyo (JP)

(72) Inventor: Keiji Yamashita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 830 days.

(21) Appl. No.: 16/389,811

(22) Filed: Apr. 19, 2019

(65) Prior Publication Data
US 2019/0332007 A1     Oct. 31, 2019

(30) Foreign Application Priority Data
Apr. 26, 2018    (JP) .................................. 2018-085318

(51) Int. Cl.
G03F 7/00     (2006.01)
H01L 21/027    (2006.01)

(52) U.S. Cl.
CPC ........ *G03F 7/0002* (2013.01); *H01L 21/0274* (2013.01)

(58) Field of Classification Search
CPC ... G03F 7/0002; H01L 21/0274; B29C 59/02; B29C 59/002
See application file for complete search history.

(56) References Cited

U.S. PATENT DOCUMENTS

| | | | |
|---|---|---|---|
| 2010/0237045 A1* | 9/2010 | Koshiba ................ | G03F 7/0002 216/48 |
| 2013/0320589 A1* | 12/2013 | Fujita .................... | B29C 59/026 264/293 |
| 2013/0323431 A1* | 12/2013 | Horibe .................. | G03F 7/0002 427/510 |

FOREIGN PATENT DOCUMENTS

| | | |
|---|---|---|
| JP | 2006352121 A | 12/2006 |
| JP | 2012039057 A | 2/2012 |
| JP | 2012-174809 A | 9/2012 |
| JP | 2016219679 A | 12/2016 |
| JP | 2018029101 A | 2/2018 |
| KR | 10-2013-0015091 A | 2/2013 |

* cited by examiner

*Primary Examiner* — Michael M. Robinson
(74) *Attorney, Agent, or Firm* — Canon U.S.A., Inc. IP Division (57) ABSTRACT

A molding apparatus for molding a composition on a substrate using a mold includes a moving unit configured to hold and move the substrate and a gaseous matter supplying unit configured to supply gaseous matter. The gaseous matter supplying unit includes a supply port arranged in a periphery of the substrate held by the moving unit, and supplies the gaseous matter from the supply port while the moving unit is moving the substrate after the composite is supplied to the molding area in the periphery of the substrate.

16 Claims, 8 Drawing Sheets

MOLDING APPARATUS THAT MOLDS COMPOSITION ON SUBSTRATE BY USING MOLD, MOLDING METHOD, AND MANUFACTURING METHOD OF ARTICLE

BACKGROUND

Field

The present disclosure relates to a molding apparatus that molds a composition on a substrate by using a mold, a molding method, and a manufacturing method of an article.

Description of the Related Art

Due to an increased demand for miniaturization of a semiconductor device or micro-electro mechanical systems (MEMS), attention has been paid to a microfabrication technique for molding a composition of an imprinting material on a substrate by molding the imprinting material on the substrate with a mold, in addition to the conventional photolithographic technique. This technique is also called an imprinting technique. Through the technique, a microscopic structure of a several nanometer size can be molded on a substrate.

A light curing method is given as one example of the imprinting technique. In an imprinting apparatus employing this light curing method, firstly, a light curable imprinting material is applied to a shot area as an imprinting area on the substrate. Next, a mold (original) and the imprinting material applied to the substrate are brought into contact (i.e., mold pressing) while positional adjustment of a pattern portion of the mold and the shot area is being executed, and the mold is filled with the imprinting material. Then, after the imprinting material is cured with irradiation of light, the imprinting material is pulled away from the mold, so that a composition of the imprinting material is molded on the substrate.

When the imprinting apparatus brings the mold and the imprinting material applied to the substrate into contact, gaseous matter may remain between the mold and the substrate, which causes a defect in the molded composition.

In order to suppress occurrence of a defect, it is necessary to wait until the remaining gaseous matter is diffused externally or dissolved into the imprinting material. Therefore, time required for executing the filling need to be set longer. Thus, lower throughput of the imprinting apparatus caused by longer filling time is one of the issues in the imprinting technique.

Japanese Patent Application Laid-Open No. 2012-174809 discusses a technique of reducing a length-measuring error. The length-measuring error occurs when helium supplied to a space between the mold and the substrate at the time of imprinting a peripheral portion of the substrate leaks to a length-measuring optical path of a laser interferometer used for adjusting the position of the substrate stage. Therefore, in order to suppress leakage of helium in the length-measuring optical path of the laser interferometer, an auxiliary member having a face of approximately the same height as a substrate surface is arranged in a periphery of the substrate.

However, if the auxiliary member is arranged in the periphery of the substrate as described in Japanese Patent Application Laid-Open No. 2012-174809, there is a possibility that the substrate and the auxiliary member have a space (narrow gap) therebetween. Even if gaseous matter such as helium is supplied to a space between the mold and the substrate at the time of imprinting the periphery of the substrate, it is difficult to fill the space with gaseous matter such as helium, so that air remains in that space. Therefore, if the periphery portion of the substrate is imprinted in a state where the space is not sufficiently filled with gaseous matter such as helium, defects will be increased.

SUMMARY

The present disclosure is directed to a molding apparatus, a molding method, and a manufacturing method of an article, which can reduce defects in a periphery portion of a substrate.

According to an aspect of the present disclosure, a molding apparatus for molding a composition on a substrate using a mold includes a moving unit configured to hold and move the substrate and a gaseous matter supplying unit configured to supply gaseous matter, wherein the gaseous matter supplying unit includes a supply port arranged in a periphery of the substrate held by the moving unit, and supplies the gaseous matter from the supply port while the moving unit is moving the substrate after the composite is supplied to a molding area in the periphery of the substrate.

Further features of the present disclosure will become apparent from the following description of exemplary embodiments with reference to the attached drawings.

DESCRIPTION OF THE EMBODIMENTS

Hereinafter, a suitable exemplary embodiment will be described in detail with reference to the appended drawings. In the below-described exemplary embodiment, an imprinting apparatus is taken as an example of a molding apparatus which forms a composite on a substrate by using a mold. In respective drawings, same reference numbers are applied to same members, and overlapping description will be omitted.

Figure 1:
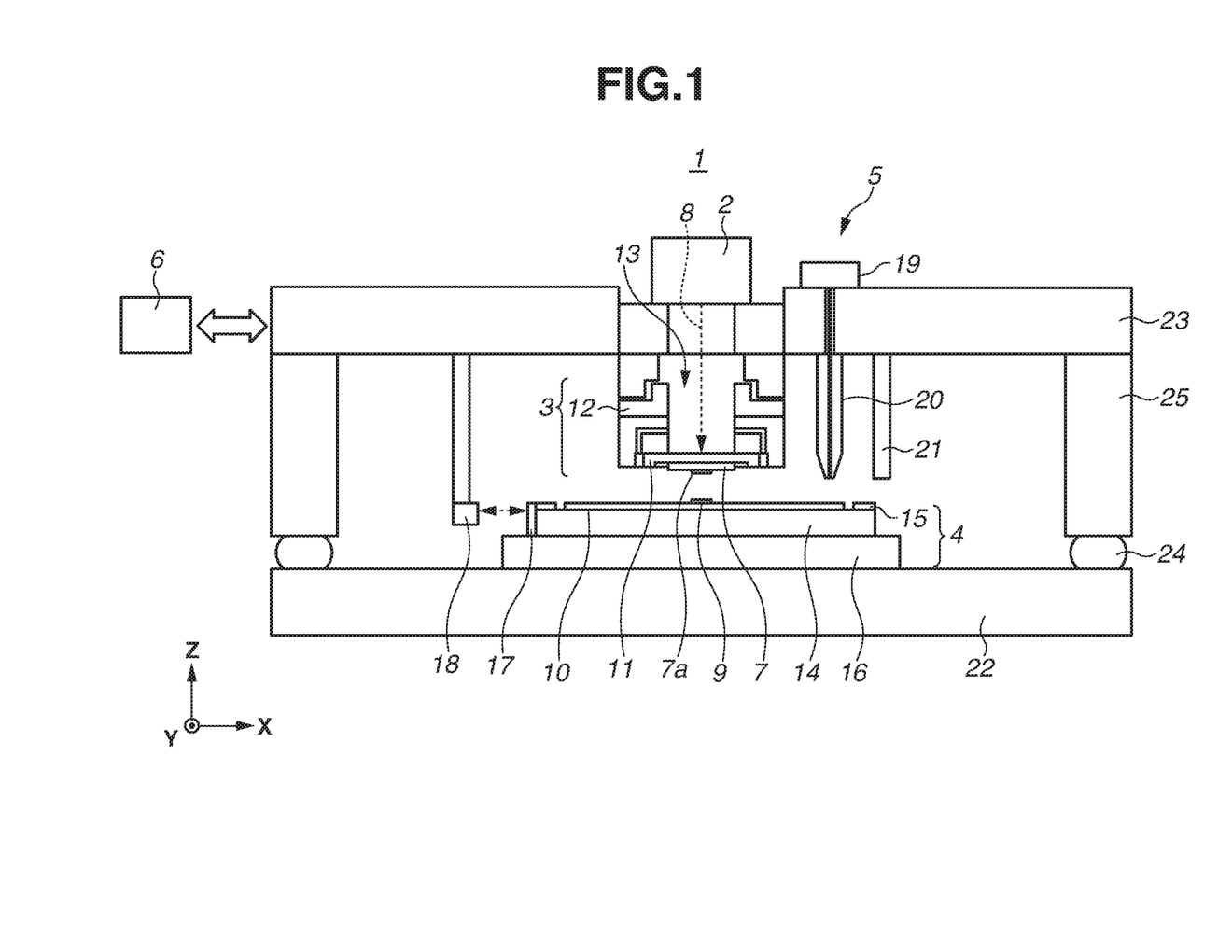
FIG. 1 is a diagram illustrating an imprinting apparatus.

Hereinafter, the first exemplary embodiment will be described. FIG. 1 is a diagram illustrating an imprinting apparatus. An imprinting apparatus 1 (molding apparatus) brings an imprinting material (composite) 9 supplied onto a substrate 10 into contact with a mold (original or template) 7. Then, curing energy is applied to the imprinting material 9, so that a cured composite, onto which a concavo-convex pattern of the mold 7 is transferred, is molded.

Herein, a curable composite (also called an imprinting material to be cured) that is cured with application of curing energy is used as the imprinting material. An electromagnetic wave or heat is used as the curing energy. The electromagnetic wave is light such as infrared light, visible light, or ultraviolet light selected from a wavelength range of 150 nm or more to 1 mm or less.

The curable composite is a composite that is curable by irradiation of light or application of heat. Of the curable composites, a light curable composite that is cured by light contains at least a polymerizable compound and a photopolymerization initiator, and may also contain a non-polymerizable compound or solvent as necessary. The non-polymerizable compound is at least one type of compound selected from compounds such as a sensitizer, a hydrogen donator, an internal mold release agent, a surface-activating agent, an antioxidizing agent, and a polymeric component.

The imprinting material is applied to a substrate in a film-like state by a spin coater or a slit coater. Alternatively, the imprinting material may be applied to a substrate in a droplet state, or may be applied thereon in an island state or a film-like state, in which a plurality of droplets is connected to each other by a liquid injection head. For example, viscosity of the imprinting material is 1 mPa·s or more and 100 mPa·s or less at a temperature of 25° C.

In the present exemplary embodiment, it is assumed that a light curing method for curing the imprinting material through irradiation of light is employed in the imprinting apparatus 1. In the below-described present exemplary embodiment, a direction parallel to an optical axis of the below-described irradiation optical system is taken as a Z-axis direction. The irradiation optical system irradiates the imprinting material on the substrate with light. In addition, two directions orthogonal to each other on a plane vertical to the Z-axis direction are taken as an X-axis direction and a Y-axis direction.

Respective units of the imprinting apparatus 1 will be described with reference to FIG. 1. A mold holding unit 3 includes a mold chuck 11 for drawing and holding the mold 7 using vacuum adsorption force or electrostatic force and a mold moving mechanism 12 for holding the mold chuck 11 to move the mold 7 (mold chuck 11). Each of the mold chuck 11 and the mold moving mechanism 12 has an opening at a central portion (inner side portion) thereof so that the imprinting material 9 on the substrate 10 is irradiated with light from the irradiation unit 2. The mold moving mechanism 12 moves the mold 7 in the Z-axis direction to selectively execute imprinting (mold pressing) or releasing (mold releasing) of the mold 7 on or from the imprinting material 9 on the substrate 10. For example, an actuator applicable to the mold moving mechanism 12 includes a linear motor or an air cylinder. In order to highly precisely adjust the position of the mold 7, the mold moving mechanism 12 may be configured of a plurality of driving systems such as a coarse motion driving system and a fine motion driving system. Further, the mold moving mechanism 12 may be configured to move the mold 7 not only in the Z-axis direction but also in the X-axis direction or the Y-axis direction. Furthermore, the mold moving mechanism 12 may include a tilt function for adjusting the position and the inclination of the mold 7 in a θ-direction (i.e., Z-axis rotation direction) thereof.

The mold 7 has a rectangular-shaped outer circumference, and a face (pattern face) thereof that faces the substrate 10 and has a pattern portion 7a on which a pattern (concavo-convex pattern such as a circuit pattern to be transferred onto the substrate 10) is formed three-dimensionally. The mold 7 consists of a light transmissive material such as quartz. Further, the mold 7 may include a circular planar-shaped cavity having a certain level of depth formed on a face irradiated with light 8.

An irradiation unit 2 includes a light source (not illustrated) and an irradiation optical system (not illustrated), and the irradiation optical system includes a combination of optical elements described below. The irradiation unit 2 irradiates the imprinting material 9 on the substrate 10 with light 8 (e.g., ultraviolet light) via the mold 7 when imprinting processing (molding processing) is executed. The irradiation unit 2 includes a light source and optical elements such as a lens, a mirror, and a light shielding plate which adjust the condition (intensity distribution of light or illumination area) of light emitted from the light source to be the light 8 appropriate for the imprinting processing. Since the light curing method is employed in the present exemplary embodiment, the imprinting apparatus 1 includes the irradiation unit 2. However, in a case where a thermal curing method is employed, the imprinting apparatus 1 includes a heat source for curing an imprinting material (heat curable imprinting material) in place of the irradiation unit 2.

A substrate chuck 14 draws and holds the substrate 10 by vacuum adsorption force or electrostatic force. An auxiliary member 15 is arranged on a circumference of the substrate chuck 14 to surround the substrate 10 held by the substrate chuck 14. The auxiliary member 15 is arranged so that an upper face of the auxiliary member 15 and an upper face of the substrate 10 held by the substrate chuck 14 are positioned on the same height. The substrate chuck 14 is mounted on a stage driving mechanism 16. Herein, the substrate chuck 14 and the stage driving mechanism 16 constitute a substrate stage 4 (moving unit). The substrate stage 4 can be moved on an X-Y plane. A position of the substrate stage 4 is adjusted when the pattern portion 7a of the mold 7 is imprinted on the imprinting material 9 on the substrate 10, so that a position of the mold 7 and a position of the substrate 10 conform to each other. For example, an actuator applicable to the substrate stage 4 includes a linear motor or an air cylinder. Further, the substrate stage 4 may be configured to move the substrate 10 not only in the X-axis direction or the Y-axis direction but also in the Z-axis direction. In addition, the imprinting apparatus 1 realizes mold pressing or mold releasing of the mold 7 by moving the mold 7 in the Z-axis direction. However, the pressing or releasing may be realized by moving the substrate 10 in the Z-axis direction. Further, the mold pressing or mold releasing of the mold 7 may be realized by relatively moving both of the mold 7 and the substrate 10 in the Z-axis direction. Furthermore, the substrate stage 4 may include a tilt function for adjusting the position and the inclination of the substrate 10 in a θ-direction (i.e., Z-axis rotation direction) thereof.

Further, the substrate stage 4 includes a plurality of reference mirrors 17 corresponding to directions of X, Y, Z, ωx, ωy, and ωz respectively on its side face. Further, the imprinting apparatus 1 includes a plurality of laser interferometers 18 which measure the position of the substrate stage 4 by irradiating the respective reference mirrors 17 with beams such as helium-neon. In FIG. 1, only one pair of the reference mirror 17 and the laser interferometer 18 is illustrated. The laser interferometer 18 measures the position of the substrate stage 4 on the basis of actual time, and a control unit 6 described below controls positional adjustment of the substrate 10 (substrate stage 4) based on the measurement value. In addition, an encoder may be used for measuring the position of the substrate stage 4.

The auxiliary member 15 has a function of preventing the below-described first gaseous matter 30 from entering a light path between the reference mirror 17 and the laser interferometer 18. Further, the auxiliary member 15 is provided so that an effect of maintaining concentration of gaseous matter supplied from a first gaseous matter supplying unit 26 described below at a high level when imprinting is executed on a shot area arranged in a periphery of the substrate 10. Herein, to the extent that the gaseous matter does not have a concentration difference of 1% or more in the upper space of the auxiliary member 15 and the upper space of the substrate 10, the upper face of the auxiliary member 15 and the upper face of the substrate 10 held by the substrate chuck 14 may have a height difference. For example, a height difference between the upper face of the auxiliary member 15 and the upper face of the substrate 10 held by the substrate chuck 14 should be 1 mm or less. More preferably, a height difference between the upper face of the auxiliary member 15 and the upper face of the substrate 10 held by the substrate chuck 14 should be 0.1 mm or less.

A material such as glass, ceramics, metal, or an imprinting material is used for the substrate 10, and a member consisting of a material different from the substrate 10 may be formed on a surface thereof as necessary. Specifically, the substrate 10 may be a silicon wafer, a compound semiconductor wafer, or a glass wafer that contains quartz as a material. Further, the substrate 10 may be a glass substrate for manufacturing a replica mask from a master mask through imprinting processing.

An applying unit 5 (composite supplying unit) is arranged in a vicinity of the mold holding unit 3, and applies the imprinting material 9 to at least one shot area (molding area) existing in the substrate 10. An ink-jet method is employed as an application method executed by the applying unit 5, and the applying unit 5 includes a container 19 for containing the imprinting material 9 yet to be cured and a discharge unit 20. It is preferable that an inner portion of the container 19 have an atmosphere containing, for example, a certain amount of oxygen which does not cause curing reaction of the imprinting material 9 so that the imprinting material 9 can be managed. Further, it is preferable that a material which does not cause particles or chemical impurities to be mixed into the imprinting material 9 be used as the material of the container 19. The discharge unit 20 includes, for example, a piezo-type discharge mechanism (i.e., ink-jet head) having a plurality of discharge ports. An application amount (discharge amount) of the imprinting material 9 can be adjusted in a range between 0.1 pL/droplet to 10 pL/droplet, and the application amount is normally set to approximately 1 pL/droplet. An entire application amount of the imprinting material 9 is determined according to the density of the pattern portion 7a and desired thickness of the residual film. The applying unit 5 disperses and applies the imprinting material 9 to a shot area as droplets and controls the application position or the application amount based on an operation instruction from the control unit 6 described below.

An alignment measurement unit 21 measures an alignment mark formed on the substrate 10. Further, the imprinting apparatus 1 includes a platen 22 on which the substrate stage 4 is placed and which forms a reference plane, a bridge platen 23 for fixing the mold holding unit 3, and a supporting post 25 extending from the platen 22, which supports the bridge platen 23 via a vibration isolator 24 for eliminating vibrations from a floor face. The imprinting apparatus 1 may further include a mold conveyance unit which takes in and out the mold 7 between an external portion of the imprinting apparatus 1 and the mold holding unit 3, and a substrate conveyance unit which takes in and out the substrate 10 between the external portion of the imprinting apparatus 1 and the substrate stage 4, although both of them are not illustrated.

The control unit 6 is configured of at least one computer including a central processing unit (CPU) or a memory. The control unit 6 is connected to the respective constituent elements of the imprinting apparatus 1 via a line, and controls operation or adjustment of the respective constituent elements of the imprinting apparatus 1 according to a program stored in the memory. Further, the control unit 6 may be arranged in a common housing integrated with the other components of the imprinting apparatus 1, or may be arranged in a different housing separately from the other components of the imprinting apparatus 1.

An imprinting method (imprinting processing) executed by the imprinting apparatus 1 will be described. First, the control unit 6 controls the substrate conveyance unit to place and fix the substrate 10 on the substrate stage 4. The control unit 6 sequentially measures the alignment mark on the substrate 10 through the alignment measurement unit 21 while driving the stage driving mechanism 16 and changing the position of the substrate 10 as appropriate, and detects the position of the substrate 10 with high precision. Then, the control unit 6 calculates each transfer coordinate from the detection result, and sequentially molds a pattern at a predetermined shot area based on the calculation result (i.e., step-and-repeat). As a flow of pattern molding with respect to one shot area, firstly, the control unit 6 controls the stage driving mechanism 16 to adjust an application position on the substrate 10 (i.e., a specific position of the shot area) to be under the discharge port of the discharge unit 20. Thereafter, the applying unit 5 applies the imprinting material 9 to the shot area on the substrate 10 through application processing. Next, the control unit 6 controls the stage driving mechanism 16 to move the substrate 10 and adjust a position thereof such that the shot area is positioned at an imprinting position just below the pattern portion 7a. Then, the control unit 6 executes positional adjustment of the pattern portion 7a and a substrate pattern on the shot area or magnification correction of the pattern portion 7a by a magnification correction mechanism. Thereafter, the control unit 6 drives the mold moving mechanism 12 to imprint the pattern portion 7a on the imprinting material 9 on the shot area (mold pressing processing). Through this imprinting, the imprinting material 9 is filled in the concavo-convex pattern of the pattern portion 7a. The control unit 6 determines completion of imprinting using a load sensor (not illustrated) arranged inside the mold holding unit 3. In the above state, through curing processing, the irradiation unit 2 emits light 8 from a rear face (upper face) of the mold 7 for a predetermined period of time to cure the imprinting material 9 with light 8 passing through the mold 7. Then, after the imprinting material 9 is cured, the control unit 6 drives the mold moving mechanism 12 again to pull the pattern portion 7a away from the substrate 10 through mold releasing processing. Through the above processing, a three-dimensional pattern (layer) of the imprinting material 9 showing the concavo-convex pattern of the pattern portion 7a is molded on the surface of the shot area on the substrate 10. By driving the substrate stage 4, the above-described series of imprinting processing is executed for a plurality of times while changing the shot area, so that the imprinting apparatus 1 can mold a plurality of imprinting material patterns on a single substrate 10.

Further, when the imprinting material 9 is filled in the pattern portion 7a by imprinting the mold 7 on the imprinting material 9 on the substrate 10, the air existing in a space between the mold 7 and the substrate 10 may enter the pattern portion 7a to cause defects in the molded pattern after the curing. Therefore, gaseous matter having one of the characteristics of high fusibility and high diffusivity may be supplied to the imprinting material 9 existing in a space between the mold 7 and the substrate 10.

Figure 2:
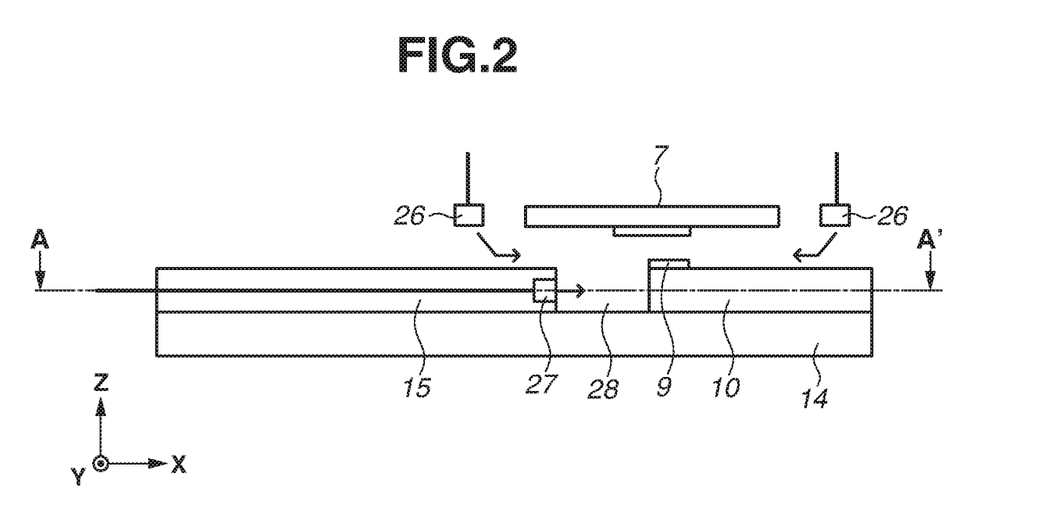
FIG. 2 is a diagram illustrating a first gaseous matter supplying unit and a second gaseous matter supplying unit.

Further, the imprinting apparatus 1 includes a first gaseous matter supplying unit 26 and the second gaseous matter supplying unit 27 which supply the gaseous matter (both of them are not illustrated in FIG. 1). The first and the second gaseous matter supplying units 26 and 27 will be described with reference to FIG. 2. FIG. 2 is a diagram illustrating the first gaseous matter supplying unit 26 and the second gaseous matter supplying unit 27. The first gaseous matter supplying unit 26 supplies the gaseous matter (hereinafter, referred to as "first gaseous matter 30") having one of the characteristics of high fusibility and high diffusivity from a gaseous matter supplying source (not illustrated) via a pipe. The first gaseous matter supplying unit 26 supplies the first gaseous matter 30 to a space between the mold 7 and the substrate 10 from a supply port arranged in a periphery of the mold 7. The supplied first gaseous matter 30 has a characteristic of fusing or diffusing with respect to at least any one of the mold 7, the imprinting material 9, and the substrate 10. The first gaseous matter 30 may include helium or carbon dioxide. However, the first gaseous matter 30 is not limited thereto.

The first gaseous matter supplying unit 26 supplies the first gaseous matter 30 to a periphery of the mold 7. Thus, the concentration of the first gaseous matter 30 is increased in the periphery of the mold 7, so that the concentration of the first gaseous matter 30 is increased in a space between the mold 7 and the substrate 10 because of a diffusion effect of the first gaseous matter 30. Further, by moving the substrate stage 4 along the X-Y plane, the concentration of the first gaseous matter 30 in the space between the mold 7 and the substrate 10 can be increased in a short time through a so-called Coanda effect.

Herein, by taking into consideration an error which occurs when the substrate 10 is conveyed to the substrate chuck 14, the auxiliary member 15 is arranged such that an interval between the substrate 10 held by the substrate chuck 14 and the auxiliary member 15 is approximately 0.5 mm to 2.0 mm. More preferably, the auxiliary member 15 should be arranged such that an interval between the substrate 10 and the auxiliary member 15 is approximately 1.0 mm to 1.1 mm. With this configuration, a space 28 surrounded by the substrate 10, the substrate chuck 14 (substrate stage 4), and the auxiliary member 15 is provided. The gaseous matter (hereinafter, referred to as "second gaseous matter") such as air, having none of the characteristics of high fusibility and high diffusivity, exists in the space 28. Therefore, the first gaseous matter 30 is not sufficiently supplied to the space 28 through the diffusion effect of the first gaseous matter 30, so that the concentration of the first gaseous matter 30 is not sufficiently increased in the space 28. Further, the concentration of the first gaseous matter 30 is not sufficiently increased in the space 28 because of the movement of the substrate stage 4. Further, if the imprinting processing is executed on the imprinting material 9 in the shot area in the periphery of the substrate 10 in a state where the second gaseous matter exists in the space 28, the second gaseous matter enters the space between the mold 7 and the substrate 10 from the space 28, so that the second gaseous matter remains as air bubbles which cause a defect.

Therefore, the imprinting apparatus 1 according to the present exemplary embodiment includes a second gaseous matter supplying unit 27 arranged on the auxiliary member 15, which supplies the first gaseous matter 30 to the space 28. Similar to the first gaseous matter supplying unit 26, the second gaseous matter supplying unit 27 supplies the first gaseous matter 30 from the gaseous matter supplying source (not illustrated) via a pipe. The second gaseous matter supplying unit 27 includes a supply port which supplies the first gaseous matter 30 to the space 28 from a side face of the auxiliary member 15 which faces the side face of the substrate 10. By supplying the first gaseous matter 30 to the space 28 from the second gaseous matter supplying unit 27, the concentration of the first gaseous matter 30 can be increased in the space 28. With this configuration, occurrence of a defect in the peripheral shot area can be reduced. Further, a porous member or a mesh-like member may be arranged on the supply port of the second gaseous matter supplying unit 27 in order to prevent flying of foreign particles or to reduce regional pressure rise when the first gaseous matter 30 is supplied thereto.

Figure 3A:
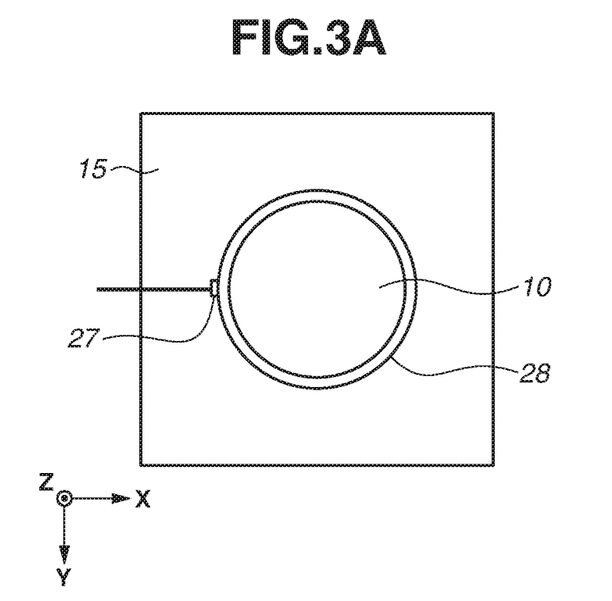
FIGS. 3A and 3B are cross-sectional diagrams illustrating the second gaseous matter supplying unit.
Figure 3B:
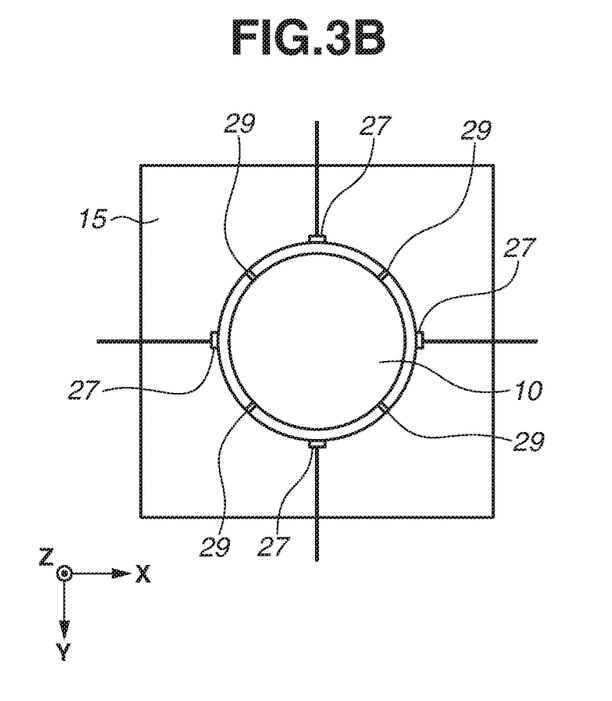

FIG. 3A or 3B is a cross-sectional diagram illustrating the second gaseous matter supplying unit 27 viewed from the upper side of a plane taken along a line A-A' in FIG. 2. The second gaseous matter supplying unit 27 in FIG. 3A has a supply port at one position on the side face of the auxiliary member 15. However, the second gaseous matter supplying unit 27 in FIG. 3B has a plurality of supply ports on the side face of the auxiliary member 15. With this configuration, in comparison to the second gaseous matter supplying unit 27 in FIG. 3A, the second gaseous matter supplying unit 27 in FIG. 3B can increase the concentration of the first gaseous matter 30 in the space 28 in a shorter time. Further, the second gaseous matter supplying unit 27 in FIG. 3B may supply the first gaseous matter 30 by switching the supply ports of the second gaseous matter supplying unit 27 according to the position of the shot area where imprinting processing is executed. Thus, an amount of the first gaseous matter 30 supplied from the second gaseous matter supplying unit 27 can be reduced. Further, as illustrated in FIG. 3B, dividing members 29 for dividing the space 28 may be arranged thereon. The dividing members 29 are arranged to divide the space 28 into spaces of a number corresponding to the supply ports of the second gaseous matter supplying unit 27. With this configuration, the concentration of the first gaseous matter 30 in the space 28 can be increased in a much shorter time.

Figure 4A:
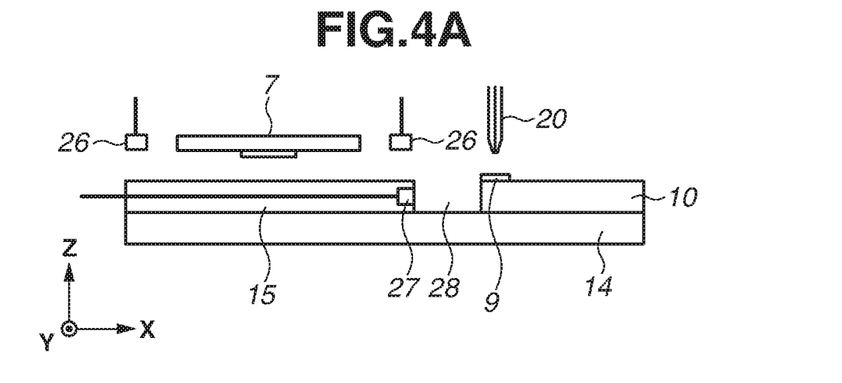
FIGS. 4A, 4B, and 4C are diagrams illustrating processing executed by a substrate stage, the first gaseous matter supplying unit, and the second gaseous matter supplying unit.
Figure 4B:
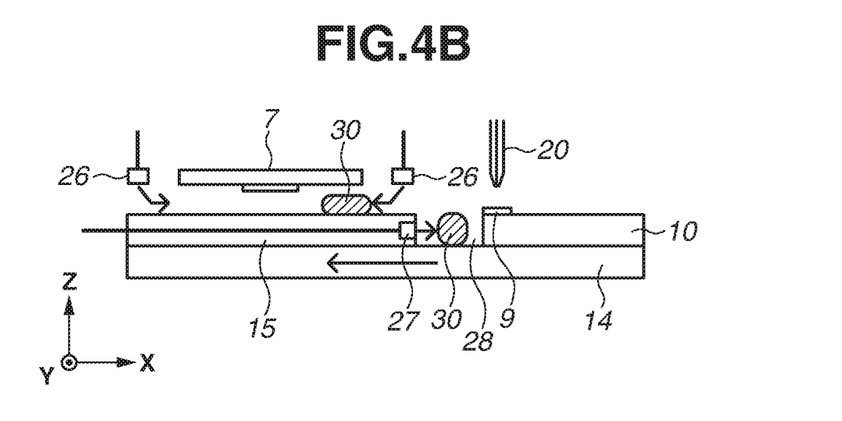
Figure 4C:
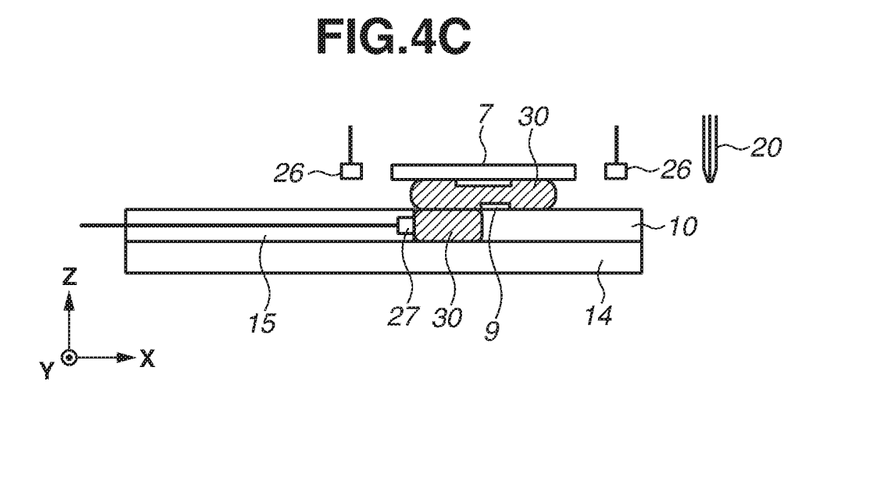
Figure 5:
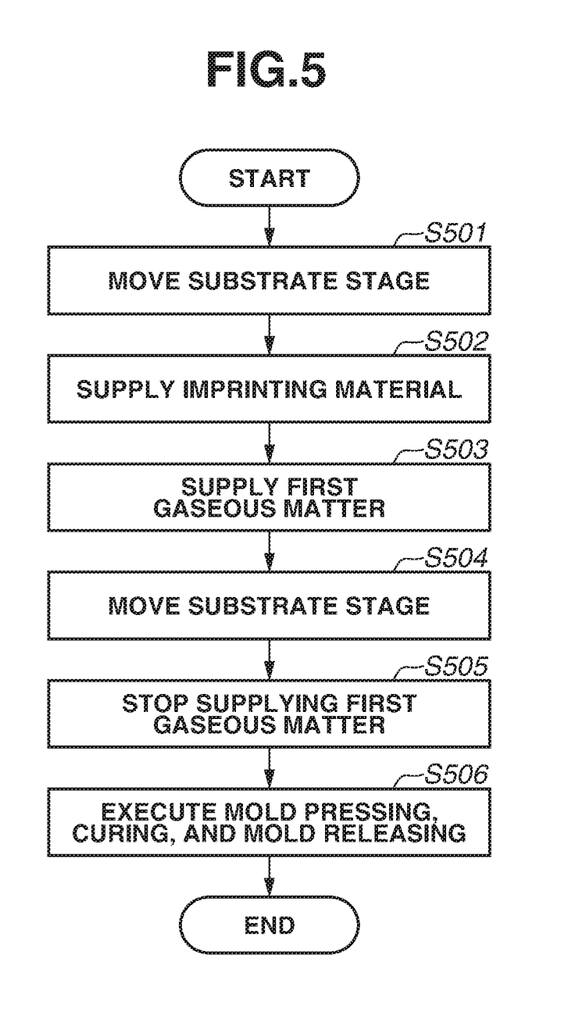
FIG. 5 is a flowchart illustrating the processing executed by the substrate stage, the first gaseous matter supplying unit, and the second gaseous matter supplying unit.

Next, a supply method of the first gaseous matter 30 in the imprinting processing will be described with reference to FIGS. 4A to 4C and FIG. 5. FIG. 4A to 4C are diagrams illustrating the processing executed by the substrate stage 4, the first gaseous matter supplying unit 26, and the second gaseous matter supplying unit 27. FIG. 5 is a flowchart illustrating the processing executed by the substrate stage 4, the first gaseous matter supplying unit 26, and the second gaseous matter supplying unit 27. First, in step S501, the control unit 6 moves the substrate stage 4 to a position where a shot area of the substrate 10 faces the discharge unit 20 (applying unit 5). Then, in step S502, the control unit 6 controls the applying unit 5 to supply the imprinting material 9 to the shot area of the substrate 10 through the discharge unit 20 (see FIG. 4A). Then, in step S503, the control unit 6 controls the first gaseous matter supplying unit 26 to supply the first gaseous matter 30 (see FIG. 4B). Further, the control unit 6 controls the second gaseous matter supplying unit 27 to supply the first gaseous matter 30 (see FIG. 4B). At this time, the control unit 6 controls the second gaseous matter supplying unit 27 to supply the first gaseous matter 30 from the supply port placed in a vicinity of the shot area where the imprinting material 9 is supplied. Then, in step S504, the control unit 6 moves the substrate stage 4 to a position where the shot area to which the imprinting material 9 is supplied faces the mold 7 (mold holding unit 3) (see FIG. 4C). At this time, the first gaseous matter 30 is supplied to a space between the substrate 10 and the mold 7 and to the space 28, and the concentration of the first gaseous matter 30 is increased sufficiently in the respective spaces. Then, in step S505, the control unit 6 controls the first gaseous matter supplying unit 26 and the second gaseous matter supplying unit 27 to stop supplying the first gaseous matter 30. Then, in step S506, mold pressing, curing, and mold releasing are executed with respect to the shot area to which the imprinting material 9 is supplied. Herein, in a case where the imprinting processing is executed on a plurality of shot areas of the substrate 10, the processing in steps S501 to S506 is executed repeatedly for a predetermined number of times. Further, in a case where the imprinting processing is executed on a shot area other than a peripheral shot area, the first gaseous matter 30 does not have to be supplied from the second gaseous matter supplying unit 27 to reduce the supply amount of the first gaseous matter 30.

Through the above-described processing, the imprinting apparatus 1 of the present exemplary embodiment can reduce a defect in the peripheral portion of the substrate 10.

Next, an imprinting apparatus according to a second exemplary embodiment will be described. A configuration which is similar to the configuration described in the first exemplary embodiment will not described hereinafter.

Figure 6:
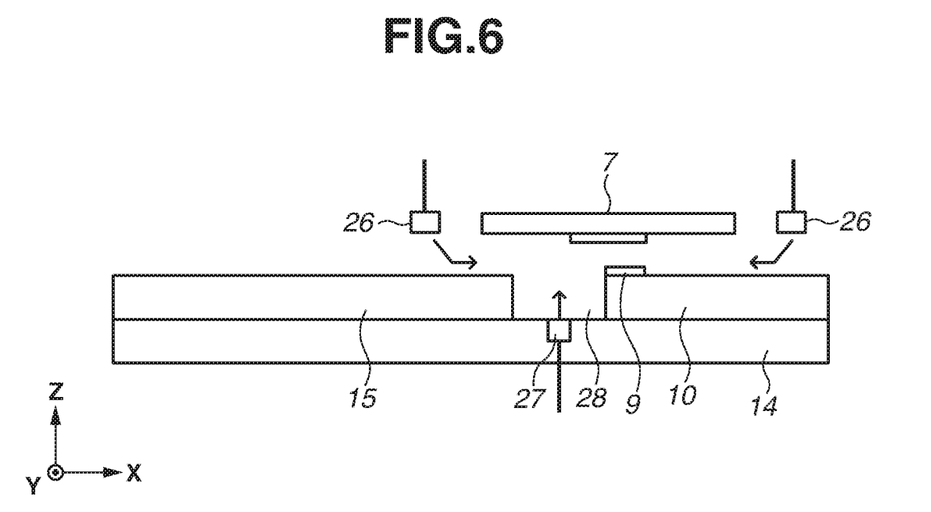
FIG. 6 is a diagram illustrating a first gaseous matter supplying unit and a second gaseous matter supplying unit according to a second exemplary embodiment.

FIG. 6 is a diagram illustrating the first gaseous matter supplying unit 26 and the second gaseous matter supplying unit 27 according to the present exemplary embodiment. Similar to the first exemplary embodiment, the first gaseous matter supplying unit 26 is arranged in a periphery of the mold 7, and supplies the first gaseous matter 30 to a space between the mold 7 and the substrate 10. Different from the first exemplary embodiment, the second gaseous matter supplying unit 27 is arranged on the substrate stage 4 (substrate chuck 14). Further, the supply port of the second gaseous matter supplying unit 27 is arranged on the upper face of the substrate stage 4 (substrate chuck 14) between the side face of the substrate 10 and the auxiliary member 15. The second gaseous matter supplying unit 27 supplies the first gaseous matter 30 to the space 28, so that the concentration of the first gaseous matter 30 in the space 28 can be increased. With this configuration, a defect in the peripheral shot area can be reduced. Further, a porous member or a mesh-like member may be arranged on the supply port of the second gaseous matter supplying unit 27 in order to prevent foreign particles from flying, or to reduce regional rise of pressure when the first gaseous matter 30 is supplied thereto. Furthermore, similar to the first exemplary embodiment, more than one supply port of the second gaseous matter supplying unit 27 or dividing members 29 for dividing the space 28 may be arranged thereon.

Further, when a diameter of the supply port of the second gaseous matter supplying unit 27 is approximately 1 mm to 2 mm, the auxiliary member 15 may be arranged to make an interval between the substrate 10 held by the substrate chuck 14 and the auxiliary member 15 approximately 3.0 mm to 4.0 mm. More preferably, the auxiliary member 15 should be arranged to make the interval between the substrate 10 and the auxiliary member 15 approximately 1.1 mm to 2.1 mm.

As described above, the imprinting apparatus 1 according to the present exemplary embodiment can reduce a defect in the periphery portion of the substrate 10.

Next, an imprinting apparatus according to a third exemplary embodiment will be described. A configuration which will not be described hereinafter has the configuration described in the first or the second exemplary embodiment.

Figure 7:
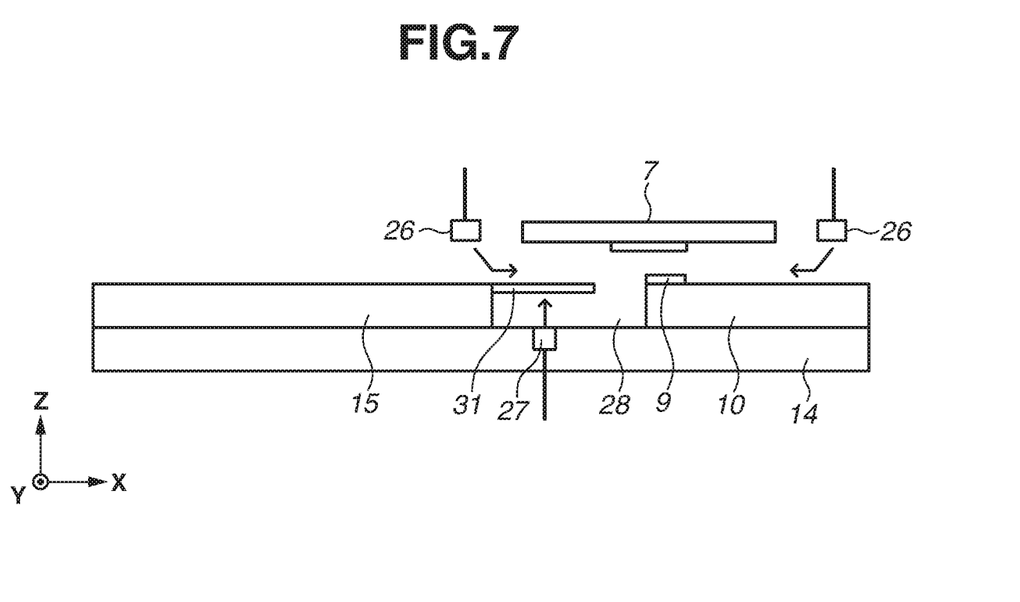
FIG. 7 is a diagram illustrating a first gaseous matter supplying unit and a second gaseous matter supplying unit according to a third exemplary embodiment.

FIG. 7 is a diagram illustrating the first gaseous matter supplying unit 26 and the second gaseous matter supplying unit 27 according to the present exemplary embodiment. Similar to the first exemplary embodiment, the first gaseous matter supplying unit 26 is arranged in a periphery of the mold 7, and supplies the first gaseous matter 30 to a space between the mold 7 and the substrate 10. Similar to the second exemplary embodiment, the second gaseous matter supplying unit 27 is arranged on the substrate stage 4 (substrate chuck 14). Further, the supply port of the second gaseous matter supplying unit 27 is arranged on the upper face of the substrate stage 4 (substrate chuck 14) between the side face of the substrate 10 and the auxiliary member 15. The second gaseous matter supplying unit 27 supplies the first gaseous matter 30 to the space 28, so that the concentration of the first gaseous matter 30 in the space 28 can be increased. Further, a shielding member 31 is arranged on the auxiliary member 15 to cover the upper side of the supply port of the second gaseous matter supplying unit 27. The shielding member 31 shields the airflow of the first gaseous matter 30 supplied from the second gaseous matter supplying unit 27, so that flying and scattering of foreign particles in the air above the upper face of the auxiliary member 15 which are caused by the airflow of the first gaseous matter 30 can be prevented and they do not adhere to the substrate 10 or the mold 7. Further, arranging the shielding member 31 is effective in that the concentration of the first gaseous matter 30 supplied from the second gaseous matter supplying unit 27 can be increased in a short time. With this configuration, a defect in the peripheral shot area can be reduced. Further, a porous member or a mesh-like member may be arranged on the supply port of the second gaseous matter supplying unit 27 in order to prevent foreign particles from flying or to reduce regional rise of pressure when the first gaseous matter 30 is supplied thereto.

Further, similar to the second exemplary embodiment, it is preferable that the auxiliary member 15 be arranged to make an interval between the substrate 10 held by the substrate chuck 14 and the auxiliary member 15 approximately 3.0 mm to 4.0 mm. Further, it is preferable that the shielding member 31 be arranged to make an interval between the substrate 10 held by the substrate chuck 14 and the shielding member 31 approximately 1.0 mm to 1.1 mm.

Further, similar to the second exemplary embodiment, in the present exemplary embodiment, the supply port of the second gaseous matter supplying unit 27 is arranged on the substrate stage 4. However, in a configuration described in the first exemplary embodiment in which the supply port of the second gaseous matter supplying unit 27 is arranged on the auxiliary member 15, the shielding member 31 according to the present exemplary embodiment may be also arranged.

Thus, the imprinting apparatus 1 according to the present exemplary embodiment can reduce a defect in the peripheral portion of the substrate 10.

<Method of Manufacturing Article>

A pattern of the cured material molded by the imprinting apparatus is permanently used for at least a part of various articles, or temporarily used when various articles are manufactured. The articles may be an electric circuit element, an optical element, micro-electro mechanical systems (MEMS), a recording element, a sensor, and a mold. The electric circuit element may be a volatile or non-volatile semiconductor memory such as a dynamic random access memory (DRAM), a static random access memory (SRAM), a flash memory, a magnetic random access memory (MRAM), or may be a semiconductor element such as a large-scale integrated circuit (LSI), a charge coupled device (CCD), an image sensor, or a field programmable gate array (FPGA). The mold may be a mold used for imprinting.

A pattern of the cured material may be directly used as at least a part of the constituent elements of the above-described articles, or may be temporarily used as a resist mask. The resist mask is removed after etching or ion implantation is executed in the course of processing the substrate.

Figure 8A:
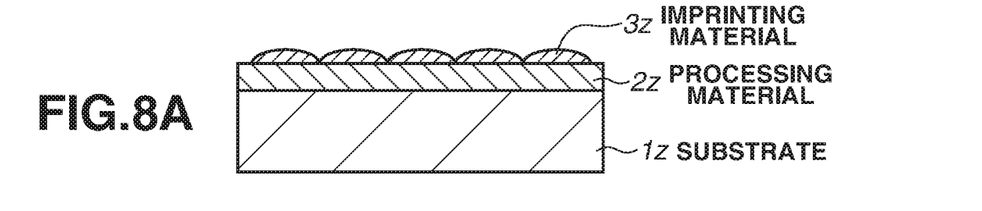
FIGS. 8A to 8F are diagrams illustrating a manufacturing method of an article.

Next, a method of manufacturing an article will be described specifically. As illustrated in FIG. 8A, a substrate $1z$ such as a silicon wafer which includes a processing material $2z$ such as an insulating material molded on its surface is prepared, and an imprinting material $3z$ is applied to a surface of the processing material $2z$ through an ink-jet method. In FIG. 8A, a plurality of droplets of imprinting material $3z$ is applied to the substrate $1z$.

Figure 8B:
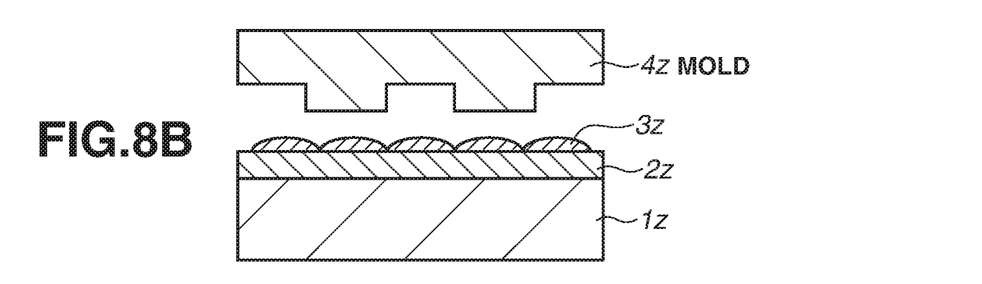
Figure 8C:
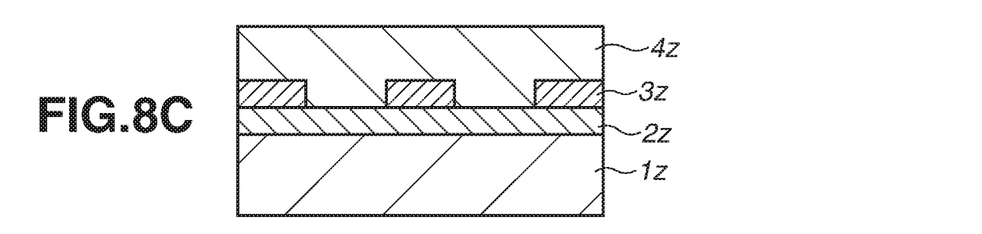

As illustrated in FIG. 8B, an imprinting mold $4z$ is arranged opposite to the substrate $1z$, with a side of a concavo-convex pattern facing the imprinting material $3z$ on the substrate $1z$. As illustrated in FIG. 8C, the substrate $1z$ on which the imprinting material $3z$ is applied and the mold $4z$ are brought into contact, and pressure is applied thereto. The imprinting material $3z$ is filled to a gap between the mold $4z$ and the processing material $2z$. In this state, when light serving as curing energy is emitted through the mold $4z$, the imprinting material $3z$ is cured.

Figure 8D:
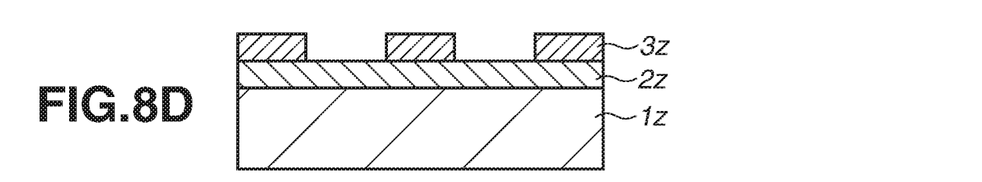

As illustrated in FIG. 8D, after the imprinting material $3z$ is cured, the mold $4z$ is pulled away from the substrate $1z$, so that a pattern of the cured imprinting material $3z$ is molded on the substrate $1z$. The pattern of the cured material is formed into a shape in which a convex portion of the cured material corresponds to the concave portion of the mold $4z$ and a concave portion thereof corresponds to the convex portion of the mold $4z$. In other words, the concavo-convex pattern of the mold $4z$ is transferred to the imprinting material $3z$.

Figure 8E:
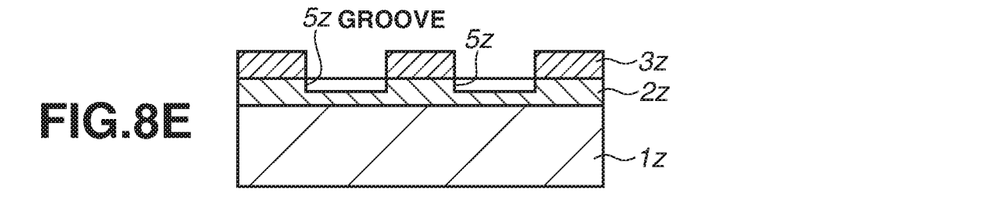
Figure 8F:
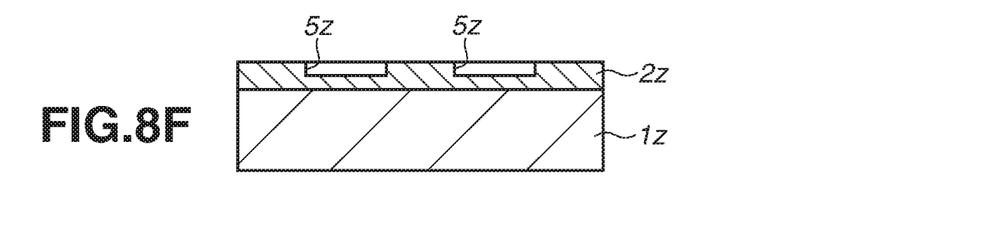

As illustrated in FIG. 8E, when etching is carried out using the pattern of the cured material as an etching resistance mask, a portion on the surface of the processing material $2z$ where the cured material does not remain or slightly remains is removed, so that a groove $5z$ is formed. As illustrated in FIG. 8F, when the pattern of the cured material is removed, an article which includes the groove $5z$ molded on a surface of the processing material $2z$ can be acquired. In the above-described manufacturing method, the pattern of the cured material has been removed. However, the pattern of the cured material may not be removed after the processing but may be used as a constituent member of the article, e.g., an interlayer insulation film included in a semiconductor device.

Although a mold having a concavo-convex pattern which is used for transferring a circuit pattern has been described as an example of the mold $4z$, the mold $4z$ may be a mold having a planar face portion, which does not have a concavo-convex pattern (i.e., blank template). The blank template is used for a planarizing apparatus (molding apparatus) which executes planarizing processing (molding processing) for planarizing and molding a composition on a substrate with the planar face portion. The planarizing processing includes processing for curing the composition through irradiation of light or application of heat in a state where the planar portion of the blank template is in contact with the composition supplied on the substrate.

Although the exemplary embodiments have been described, the present disclosure is not limited to the above exemplary embodiments, and many variations and modifications are possible within the scope of the present disclosure.

Although the imprinting apparatus which executes pattern molding on a substrate by shaping (molding) the imprinting material on the substrate with a mold has been described as an example of the molding apparatus, the molding apparatus is not limited to the imprinting apparatus. The molding apparatus may be a planarizing apparatus which executes planarizing processing (molding processing) for planarizing and molding a composition on a substrate by using a mold having a planar face portion, which does not have a concavo-convex pattern (i.e., blank template) as a mold.

Further, the first to the third exemplary embodiments may be implemented independently, or may be implemented by combining with each other.

According to the present disclosure, it is possible to provide a molding apparatus, a molding method, and a manufacturing method of an article configured to reduce a defect in a periphery of a substrate.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-085318, filed Apr. 26, 2018, which is hereby incorporated by reference herein in its entirety.

What is claimed is:

1. A molding apparatus for molding a composition on a substrate by using a mold, comprising:
    a mold holding unit configured to hold the mold;
    a moving unit configured to hold and move the substrate;
    a first supply port configured to supply gaseous matter between the substrate and the mold from a direction above the substrate;
    a second supply port configured to directly supply the gaseous matter to a space surrounded by a plurality of faces including the side face of the substrate and the upper face of the moving unit; and
    a control unit configured to control the supply of the gaseous matter from the first supply port and the second supply port,
    wherein the first supply port is arranged in a periphery of the mold holding unit,
    wherein the second supply port is arranged, across the space, in a position opposing to the side face of the substrate, or in the lower side of the space, and
    wherein, when the moving unit holds and moves the substrate of which a molding area is supplied with the composition, the control unit controls the supply of the gaseous matter to be supplied from both of the first supply port and the second supply port.

2. The molding apparatus according to claim 1, wherein the second supply port is arranged at a position lower than an upper face of the substrate held by the moving unit.

3. The molding apparatus according to claim 1, wherein the moving unit includes an auxiliary member that surrounds the periphery of the substrate held by the moving unit.

4. The molding apparatus according to claim 3, wherein the second supply port is arranged on an upper face of the moving unit at a position between the substrate held by the moving unit and the auxiliary member.

5. The molding apparatus according to claim 4, further comprising a third supply port that is different from the first supply port and the second supply port, wherein the third supply port is arranged on a side face of the auxiliary member which faces a side face of the substrate held by the moving unit.

6. The molding apparatus according to claim 3, wherein the moving unit includes a shielding member that covers the space.

7. The molding apparatus according to claim 3, wherein a difference between a height of the upper face of the auxiliary member and a height of the upper face of the substrate held by the molding unit is 1 mm or less.

8. The molding apparatus according to claim 3, wherein the molding apparatus comprises a plurality of supply ports including the first supply port and the second supply port, and switches the supply port for supplying the gaseous matter based on a position of a molding area on the substrate where the composition is molded.

9. The molding apparatus according to claim 8, wherein the moving unit includes dividing members for dividing a space between the substrate held by the moving unit and the auxiliary member into a plurality of spaces, and at least one of the supply ports is arranged in each of the spaces.

10. The molding apparatus according to claim 1, wherein the second supply port supplies gaseous matter containing at least any one of helium and carbon dioxide.

11. The molding apparatus according to claim 1, wherein the second supply port supplies the gaseous matter when the first supply port supplies the gaseous matter.

12. The molding apparatus according to claim 11, wherein the first supply port supplies gaseous matter containing at least any one of helium and carbon dioxide.

13. The molding apparatus according to claim 11, further comprising a composition supplying unit configured to supply the composition to a molding area on the substrate, wherein the second supply port supplies the gaseous matter while the moving unit is moving the molding area from a position facing the composition supplying unit to a position facing the mold holding unit.

14. The molding apparatus according to claim 1, wherein the molding apparatus brings a pattern of the mold into contact with the composition to mold a pattern of the composition.

15. The molding apparatus according to claim 1, wherein the molding apparatus brings a planar face portion of the mold into contact with the composition to planarize the composition.

16. The molding apparatus according to claim 3, wherein the second supply port is arranged on a side face of the auxiliary member that faces a side face of the substrate held by the moving unit.

* * * * *